US012718978B2

(12) United States Patent
Li et al.

(10) Patent No.: US 12,718,978 B2
(45) Date of Patent: Aug. 25, 2026

(54) FERRITE BEAD, BIAS CIRCUIT, OPTICAL MODULE, AND COMMUNICATION DEVICE

(71) Applicant: HUAWEI TECHNOLOGIES CO., LTD., Shenzhen (CN)

(72) Inventors: Zhiwei Li, Wuhan (CN); Lihui Hu, Dongguan (CN); Wenjun Shi, Wuhan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 229 days.

(21) Appl. No.: 18/758,031

(22) Filed: Jun. 28, 2024

(65) Prior Publication Data

US 2024/0347261 A1 Oct. 17, 2024

Related U.S. Application Data

(63) Continuation of application No. PCT/CN2022/142451, filed on Dec. 27, 2022.

(30) Foreign Application Priority Data

Dec. 31, 2021 (CN) ........................ 202111665627.5

(51) Int. Cl.
*H01F 27/29* (2006.01)
*H01F 27/24* (2006.01)
(Continued)

(52) U.S. Cl.
CPC ........... *H01F 27/292* (2013.01); *H01F 27/24* (2013.01); *H05K 1/11* (2013.01); *H05K 1/181* (2013.01); *H05K 2201/1003* (2013.01)

(58) Field of Classification Search
CPC ......... H01F 27/292; H01F 27/24; H05K 1/11; H05K 1/181
(Continued)

(56) References Cited

U.S. PATENT DOCUMENTS 9,666,356 B2 5/2017 Kato et al.
9,984,805 B2 5/2018 Kudo et al.
(Continued)

FOREIGN PATENT DOCUMENTS

CN 110753980 A 2/2020
JP 2004103796 A 4/2004
(Continued)

OTHER PUBLICATIONS

PCT International Search Report for Application No. PCT/CN2022/142451 dated Dec. 27, 2022, 47 pages.

*Primary Examiner* — Andargie M Aychillhum

(57) ABSTRACT

This application relates to the field of electronic component technologies, and to a ferrite bead, a bias circuit, an optical module, and a communication device. The ferrite bead includes: a ferrite bead body, a first fastening terminal, a second fastening terminal, and an external terminal. The first fastening terminal and the second fastening terminal are connected to the ferrite bead body, and the first fastening terminal and the second fastening terminal are configured to fasten the ferrite bead body. The ferrite bead body includes a coil structure, and the coil structure has a first electrical connection end and a second electrical connection end. At least one of the first electrical connection end and the second electrical connection end is electrically connected to the external terminal. An area of the external terminal is less than an area of the first fastening terminal and an area of the second fastening terminal.

15 Claims, 9 Drawing Sheets

(51) Int. Cl.
*H05K 1/11* (2006.01)
*H05K 1/181* (2026.01)

(58) Field of Classification Search
USPC .......................................................... 174/260
See application file for complete search history.

(56) References Cited

U.S. PATENT DOCUMENTS

2020/0203881 A1* 6/2020 Marzano ................ H01G 4/232
2021/0183563 A1* 6/2021 Maki ....................... H01F 37/00

FOREIGN PATENT DOCUMENTS

JP 2006294927 A 10/2006
JP 2013115053 A 6/2013
JP 2015076436 A 4/2015
JP 2018190814 A 11/2018

* cited by examiner

FERRITE BEAD, BIAS CIRCUIT, OPTICAL MODULE, AND COMMUNICATION DEVICE

CROSS-REFERENCE TO RELATED APPLICATIONS

This application is a continuation of International Application No. PCT/CN2022/142451, filed on Dec. 27, 2022, which claims priority to Chinese Patent Application No. 202111665627.5, filed on Dec. 31, 2021. The disclosures of the aforementioned applications are hereby incorporated by reference in their entireties.

TECHNICAL FIELD

This application relates to the field of electronic component technologies, and in particular, to a ferrite bead, a bias circuit, an optical module, and a communication device.

BACKGROUND

In an optical module, a bias circuit is mainly used at a transmit end of the optical module. The bias circuit generally includes a substrate, a ferrite bead disposed on the substrate, and a trace connected to the ferrite bead, and is configured to provide a bias voltage or a bias current for a drive chip, a laser chip, and the like, so that the drive chip and the laser chip operate in a normal bias state.

With continuous development of communication networks, there is an increasingly high requirement on a system capacity of the optical module, and a corresponding required module rate also continuously increases with the requirement, from current 400 GE to 800 GE or even 1.6 TE. A single-channel rate needs to be accordingly increased to 200 Gbps or even higher, to achieve such a large capacity in a current high-speed pluggable module (QSFP-DD). When a system rate is further increased to 224 Gbps or even higher, the bias circuit needs to have a higher bandwidth (that is, a bandwidth BW of the ferrite bead needs to be greater than or equal to 60 GHz) to meet an application requirement.

However, a conventional ferrite bead is limited by parasitic effect of a material and packaging, and it is difficult to further increase a bandwidth. Therefore, a new ferrite bead is urgently needed to resolve a problem that it is difficult to increase a bandwidth of a ferrite bead in conventional technologies.

SUMMARY

This application provides a ferrite bead, a bias circuit, an optical module, and a communication device, to reduce a parasitic capacitance and increase a bandwidth of the ferrite bead.

According to a first aspect, this application provides a ferrite bead, including: a ferrite bead body, a first fastening terminal, a second fastening terminal, and an external terminal. Each of the first fastening terminal and the second fastening terminal is connected to the ferrite bead body, and the first fastening terminal and the second fastening terminal are configured to fasten the ferrite bead body. The ferrite bead body includes a coil structure, and the coil structure has a first electrical connection end and a second electrical connection end. At least one of the first electrical connection end and the second electrical connection end is electrically connected to the external terminal. An area of the external terminal is less than an area of the first fastening terminal and an area of the second fastening terminal. Specifically, the external terminal may be connected to the at least one of the first electrical connection end and the second electrical connection end of the ferrite bead body, and the area of the external terminal is less than the area of the first fastening terminal and the area of the second fastening terminal. A parasitic capacitance generated between the external terminal and the ferrite bead body is less than a parasitic capacitance generated between the first fastening terminal or the second fastening terminal and the ferrite bead body, that is, a parasitic capacitance generated inside the ferrite bead may be reduced. In addition, when the ferrite bead is disposed on a substrate, an external parasitic capacitance generated between the external terminal and the substrate is less than an external parasitic capacitance generated between the first fastening terminal or the second fastening terminal and the substrate, to increase a bandwidth of the ferrite bead.

It should be noted that an axis of the coil structure in the ferrite bead body may extend in a horizontal direction. When the coil structure in the ferrite bead body extends in the horizontal direction, the first fastening terminal and the second fastening terminal may be disposed on a same side of the axis of the ferrite bead body. When the coil structure in the ferrite bead body extends in a vertical direction (an axis also extends in the vertical direction), the first fastening terminal and the second fastening terminal may be disposed on two sides of the axis of the ferrite bead body.

In a possible embodiment, the external terminal may be electrically connected to the first electrical connection end, and the second electrical connection end may be electrically connected to the first fastening terminal or the second fastening terminal; or the external terminal may be electrically connected to the second electrical connection end, and the first electrical connection end may be electrically connected to the second fastening terminal or the first fastening terminal. Because the area of the external terminal is less than the area of the first fastening terminal and the area of the second fastening terminal, the parasitic capacitance inside the ferrite bead may be reduced. In addition, when the parasitic capacitance inside the ferrite bead is reduced, the external parasitic capacitance between the external terminal and the substrate is also less than the external parasitic capacitance between the first fastening terminal and the second fastening terminal and the substrate, so that an overall parasitic capacitance of the ferrite bead is reduced, and the bandwidth of the ferrite bead is increased.

It should be noted that the second electrical connection end may be disposed on a side close to the first fastening terminal, and the first electrical connection end may be disposed on a side close to the second fastening terminal. When the external terminal is connected to the first electrical connection end, the external terminal is disposed on a side close to the first electrical connection end, so that the first electrical connection end is connected to the external terminal. When the external terminal is connected to the second electrical connection end, the external terminal is disposed on a side close to the second electrical connection end, so that the second electrical connection end is connected to the external terminal.

In a possible embodiment, to increase the bandwidth of the ferrite bead, reduce the parasitic capacitance inside the ferrite bead, and reduce an external parasitic capacitance generated when the ferrite bead is used in the substrate, the external terminal may include a first external terminal and a second external terminal. The first external terminal may be electrically connected to the second electrical connection end of the ferrite bead body, and the second external terminal may be electrically connected to the first electrical connection end of the ferrite bead body. In this disposition manner, the ferrite bead body is not electrically connected to the first fastening terminal and the second fastening terminal, and an area of the first external terminal and an area of the second external terminal is less than the area of the first fastening terminal and the area of the second fastening terminal, that is, the parasitic capacitance inside the ferrite bead can be reduced. In addition, when the parasitic capacitance inside the ferrite bead is reduced, an external parasitic capacitance generated between the first external terminal or the second external terminal and the substrate is further reduced, to increase the bandwidth of the ferrite bead.

It should be noted that the first external terminal and the second external terminal may have a same area.

According to a second aspect, this application further provides a bias circuit. The bias circuit may include a substrate and the ferrite bead in any technical solution of the first aspect. The ferrite bead is fastened on the substrate. A trace, a first pad, and a second pad may be disposed on the substrate. The second pad is configured to fasten the ferrite bead, the first electrical connection end is connected to the first pad, and the second electrical connection end of the ferrite bead is connected to the trace. Specifically, because at least one of the first fastening terminal and the second fastening terminal in the ferrite bead is not electrically connected to an external circuit, the external parasitic capacitance between the ferrite bead and the substrate may be reduced, so that the ferrite bead used in the bias circuit can have a high bandwidth.

In a possible embodiment, there may be one ferrite bead in the bias circuit, and the ferrite bead includes one external terminal. The second electrical connection end of the ferrite bead may be electrically connected to the first fastening terminal, and the first electrical connection end may be connected to the external terminal. More specifically, the first fastening terminal may be fastened to the trace, and the second fastening terminal may be welded to the second pad on the substrate, so that the ferrite bead is fastened on the substrate, and the external terminal may be connected to the first pad on the substrate through a wire. Alternatively, the second electrical connection end in the ferrite bead may be electrically connected to the second fastening terminal, and the first electrical connection end may be connected to the external terminal. More specifically, the second fastening terminal may be fastened to the trace, and the first fastening terminal may be welded to the second pad on the substrate, so that the ferrite bead is fastened on the substrate, and the external terminal may be connected to the first pad on the substrate through a wire. Alternatively, the second electrical connection end of the ferrite bead may be electrically connected to the external terminal, and the first electrical connection end may be electrically connected to the second fastening terminal. More specifically, the second fastening terminal may be fastened to the first pad, and the first fastening terminal may be welded to the second pad on the substrate, so that the ferrite bead is fastened on the substrate, and the external terminal may be connected to the trace on the substrate through a wire. Alternatively, the first electrical connection end may be electrically connected to the first fastening terminal, the first fastening terminal may also be fastened to the first pad, and the second fastening terminal may be welded to the second pad on the substrate, so that the ferrite bead is fastened on the substrate, and the external terminal may be connected to the trace on the substrate through a wire. In this disposition manner, the external terminal may be disposed on a side that is of the ferrite bead body and that is away from the substrate, and the area of the external terminal is less than the area of the first fastening terminal and the area of the second fastening terminal, so that the external parasitic capacitance between the external terminal and the substrate can be significantly reduced, to reduce the external parasitic capacitance generated between the first fastening terminal or the second fastening terminal and the substrate, and increase the bandwidth of the ferrite bead. In addition, the ferrite bead is connected to the first pad through a wire, which can improve flexibility of arranging the ferrite bead on the substrate, reduce an overall size of the bias circuit, and facilitate miniaturization of the bias circuit.

When there is one ferrite bead in the bias circuit, and the external terminals of the ferrite bead include a first external terminal and a second external terminal, the second electrical connection end and the first electrical connection end of the ferrite bead are respectively electrically connected to the first external terminal and the second external terminal, and the first fastening terminal and the second fastening terminal of the ferrite bead body are separately welded to the second pad, so that the ferrite bead is fastened on the substrate, and the first external terminal and the second external terminal may be respectively electrically connected to the trace and the first pad through a wire. In this way, the ferrite bead is electrically connected to the bias circuit. In this disposition manner, both the first external terminal and the second external terminal may be disposed on a side that is of the ferrite bead body and that is away from the substrate, and the area of the first external terminal and the area of the second external terminal is less than the area of the first fastening terminal and the area of the second fastening terminal, so that the parasitic capacitance between the first external terminal or the second external terminal and the substrate can be significantly reduced, to reduce the external parasitic capacitance generated between the first fastening terminal or the second fastening terminal and the substrate, and increase the bandwidth of the ferrite bead. In addition, the ferrite bead is connected to the first pad and the trace through a wire, which can improve flexibility of arranging the ferrite bead on the substrate, reduce an overall size of the bias circuit, and facilitate miniaturization of the bias circuit. In addition, because the trace is not in direct contact with the first fastening terminal and the second fastening terminal, a sudden change of impedance at a contact position between the trace and the ferrite bead can be effectively avoided, to improve performance of the bias circuit.

In a possible embodiment, there may be two ferrite beads in the bias circuit, and each of the two ferrite beads is a ferrite bead including only one external terminal. A first fastening terminal or a second fastening terminal on one ferrite bead is fastened to the trace and electrically connected to the trace, a first fastening terminal or a second fastening terminal on the other ferrite bead is electrically connected to the first pad, and external terminals on the two ferrite beads are connected through a wire. A second fastening terminal or a first fastening terminal on one of the ferrite beads, and a second fastening terminal or a first fastening terminal on the other ferrite bead are welded to one second pad on the substrate. In this disposition manner, the external terminal may be disposed on a side that is of the ferrite bead body and that is away from the substrate, and the area of the external terminal is less than the area of the first fastening terminal and the area of the second fastening terminal, so that the parasitic capacitance between the external terminal and the substrate can be significantly reduced, to reduce the external parasitic capacitance generated between the first fastening terminal or the second fastening terminal and the substrate, and increase the bandwidth of the ferrite bead.

When there are two ferrite beads in the bias circuit, each of external terminals of the two ferrite beads includes a first external terminal and a second external terminal, and second electrical connection ends and first electrical connection ends of the two ferrite beads are respectively electrically connected to first external terminals and second external terminals, both the first fastening terminal and the second fastening terminal of each ferrite bead are welded to the second pad, the first external terminals or the second external terminals of the two ferrite beads are electrically connected to the trace and the first pad located on the substrate through a wire, and the two ferrite beads are electrically connected through a wire. In this disposition manner, the parasitic capacitance between the first external terminal or the second external terminal and the substrate can be significantly reduced, to reduce the external parasitic capacitance generated between the first fastening terminal or the second fastening terminal and the substrate, and increase the bandwidth of the ferrite bead. In addition, the ferrite bead is connected to the first pad and the trace through a wire, which can improve flexibility of arranging the ferrite bead on the substrate, reduce an overall size of the bias circuit, and facilitate miniaturization of the bias circuit.

It should be noted that when the ferrite bead is used in the bias circuit, a quantity of ferrite beads may be three, four, or the like, and the quantity of ferrite beads may be adjusted according to an actual requirement. In addition, when there are a plurality of ferrite beads, the ferrite beads in the bias circuit may be used together with two types of ferrite beads in the foregoing solution.

According to a third aspect, this application further provides an optical module, including a housing and a bias circuit that is in any technical solution of the second aspect and that is disposed in the housing. The optical module may further include a digital signal processor, a driver, a laser, an optical detector, and a trans-impedance amplifier that are disposed in the housing. An electrical signal may enter the driver through the digital signal processor, the electrical signal that passes through the driver enters the laser, and the laser converts the electrical signal into an optical signal for transmission. The optical signal may enter the digital signal processor through the optical detector and the trans-impedance amplifier, and the digital signal processor may convert the optical signal into an electrical signal for transmission. The bias circuit may be disposed between the driver and the laser, and a bias circuit may also be disposed in the digital signal processor. Because this kind of bias circuits are disposed, a rate of the optical module can be increased.

According to a fourth aspect, this application further provides a communication device. The communication device may include a processor, the optical module in the third aspect, and an outer housing that accommodates the optical module and the processor. The optical module may be connected to the processor and the outside through an optical fiber. Because the rate of the optical module is high, a rate of a communication device having the optical module is also high, to meet a requirement for fast communication. The communication device may be an optical communication device, a router, a switch, a server, or the like.

REFERENCE NUMERALS

1: ferrite bead terminal; 2: thin-film coil; 10: ferrite bead body; 20: first fastening terminal; 30: second fastening terminal; 40: external terminal; 41: first external terminal; 42: second external terminal; 100: substrate; 101: trace; 102: first pad; 103: second pad; 110: wire.

DESCRIPTION OF EMBODIMENTS

To make objectives, technical solutions, and advantages of this application clearer, the following further describes this application in detail with reference to accompanying drawings.

A bandwidth is an important performance indicator of a ferrite bead, and the indicator is mainly related to a material and a structure inside the ferrite bead. Abasic structure of an existing ferrite bead is shown in FIG. 1*a* to FIG. 1*f*. The ferrite bead usually includes a thin-film coil 2, a ferrite material, and a ferrite bead terminal 1. The thin-film coil 2 is surrounded by the ferrite material, the ferrite bead terminal 1 is usually located at left and right ends of the ferrite bead, and the ferrite bead terminal 1 is configured to electrically connect to the outside.

Figure 2:
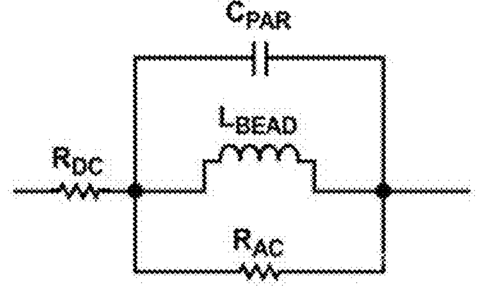
FIG. 2 is an equivalent diagram of a ferrite bead in a conventional technology.

An ideal ferrite bead may be equivalent to a pure inductor L, and have low impedance for a low-frequency signal and high impedance for a high-frequency signal, that is, the ferrite bead may be used to pass a direct-current signal and isolate an alternating-current signal. An actual ferrite bead may be equivalent to a circuit structure shown in FIG. 2. $C_{PAR}$ is an equivalent parasitic capacitance, $R_{AC}$ is impedance for an AC signal, $L_{BEAD}$ is equivalent inductance of the ferrite bead, and the equivalent inductance is related to a size of the ferrite bead. $R_{DC}$ is DC impedance corresponding to the ferrite bead. A value of the impedance can be generally obtained by consulting ferrite bead specifications.

When a material is specified, bandwidth performance of the ferrite bead is closely related to $C_{PAR}$, and $C_{PAR}$ is closely related to the structure of the ferrite bead. Larger $C_{PAR}$ indicates a lower corresponding bandwidth of the ferrite bead. To increase a bandwidth of the ferrite bead, $C_{PAR}$ needs to be controlled at an appropriate level.

Figure 1A:
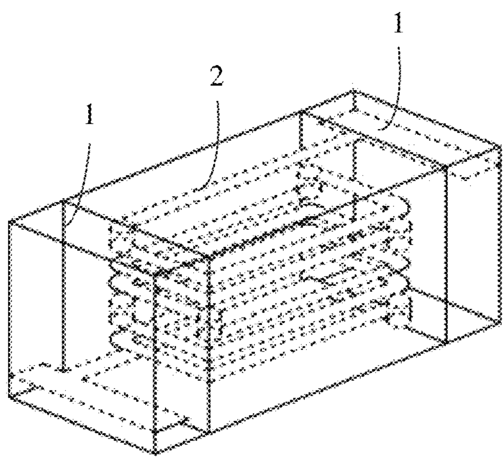
FIG. 1*a* to FIG. if are schematics of a structure of a ferrite bead in a conventional technology.
Figure 1B:
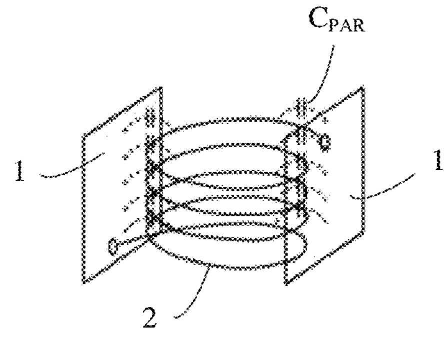
Figure 1C:
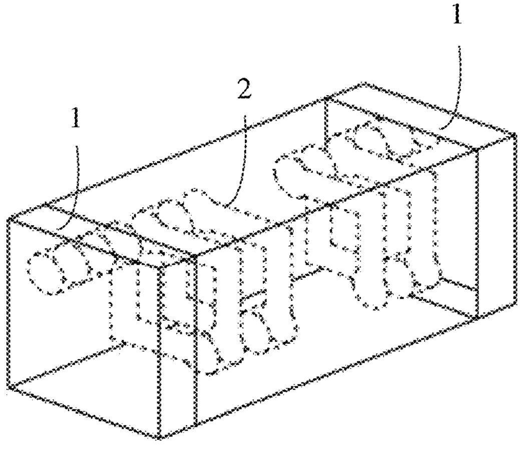
Figure 1D:
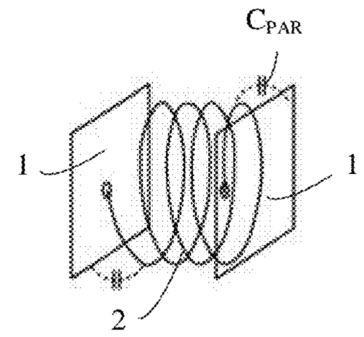
Figure 1E:
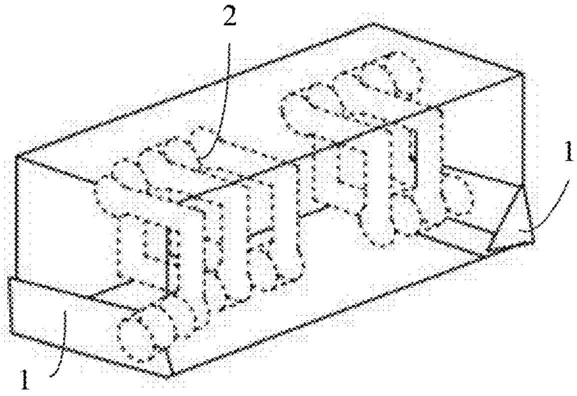
Figure 1F:
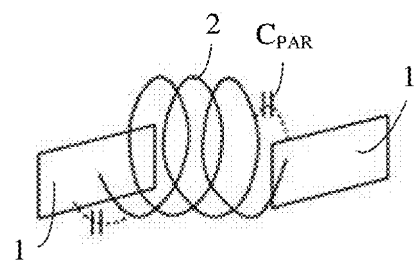

As shown in FIG. 1*a*, $C_{PAR}$ of the conventional ferrite bead mainly exists between the thin-film coil 2 and the ferrite bead terminal 1. To reduce a parasitic capacitance between the thin-film coil 2 and the ferrite bead terminal 1, the thin-film coil 2 inside the ferrite bead is changed from a vertical winding manner in FIG. 1*a* to a horizontal winding manner in FIG. 1*c* and FIG. 1*e*. However, the parasitic capacitance between the ferrite bead terminal 1 and the thin-film coil 2 still exists. To increase the bandwidth of the ferrite bead, a size of the ferrite bead terminal 1 may be reduced. In this way, the parasitic capacitance between the ferrite bead terminal 1 and the thin-film coil 2 can be further reduced. The structure of the ferrite bead in FIG. 1*e* reduces the size of the ferrite bead terminal 1. However, to ensure stability of the ferrite bead, the size of the ferrite bead terminal 1 cannot be reduced without limitation. In addition, the structure of the ferrite bead in FIG. 1*e* can support the bandwidth of the ferrite bead to increase to 40 GHz, that is, a performance requirement of 100 G on a single wavelength is met.

Figure 3:
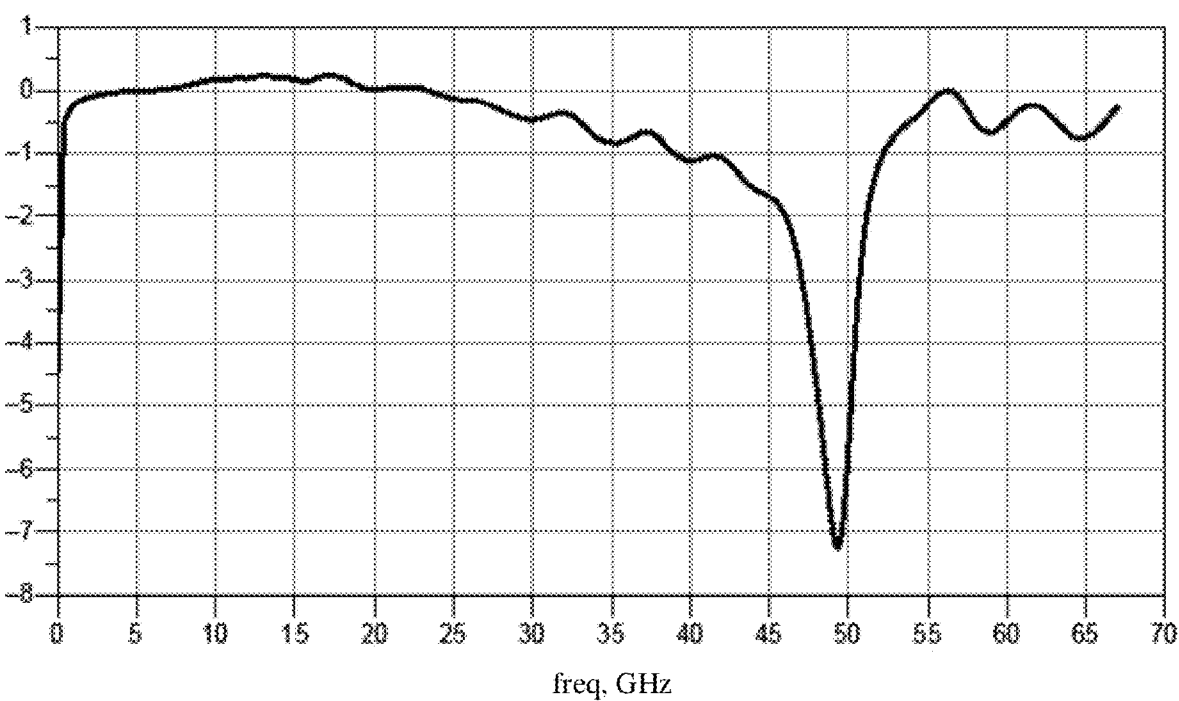
FIG. 3 is a detection diagram of the ferrite bead in FIG. 1*e;*

However, for a transmission requirement for a higher rate, for example, in transmission of 224 G on a single wavelength, the bandwidth of the ferrite bead needs to be increased to a level greater than 60 GHz. FIG. 3 is a diagram of a measured bandwidth of a ferrite bead. A structure of the used ferrite bead is shown in a solution in FIG. 1*e*. According to a test result diagram, the bandwidth decreases significantly at approximately 48 GHz. Further analysis shows that the decrease is mainly caused by a parasitic capacitance introduced by a pad of the ferrite bead. The pad of the ferrite bead (that is, a ferrite bead terminal) is large, so that a high parasitic capacitance is introduced between the pad and a substrate. The parasitic capacitance severely limits a further increase of the bandwidth of the ferrite bead. Therefore, it is difficult to implement a bandwidth greater than 60 GHz by using a conventional ferrite bead structure.

Therefore, to reduce an external parasitic capacitance generated when a ferrite bead is used in a substrate, this application provides a new ferrite bead.

Terms used in the following embodiments are merely for a purpose of describing specific embodiments, but are not intended to limit this application. Terms “one”, “a”, “the”, “the foregoing”, “this”, and “the one” of singular forms used in this specification and the appended claims of this application are also intended to include forms such as “one or more”, unless otherwise specified in the context clearly.

Reference to “an embodiment”, “some embodiments”, or the like described in this specification indicates that one or more embodiments of this application include a specific feature, structure, or characteristic described with reference to embodiments. Therefore, statements such as “in an embodiment”, “in some embodiments”, “in some other embodiments”, and “in other embodiments” that appear at different places in this specification do not necessarily mean reference to a same embodiment. Instead, the statements mean “one or more but not all of embodiments”, unless otherwise specifically emphasized in another manner. Terms “include”, “comprise”, “have”, and their variants all mean “include but are not limited to”, unless otherwise specifically emphasized in another manner.

Figure 4A:
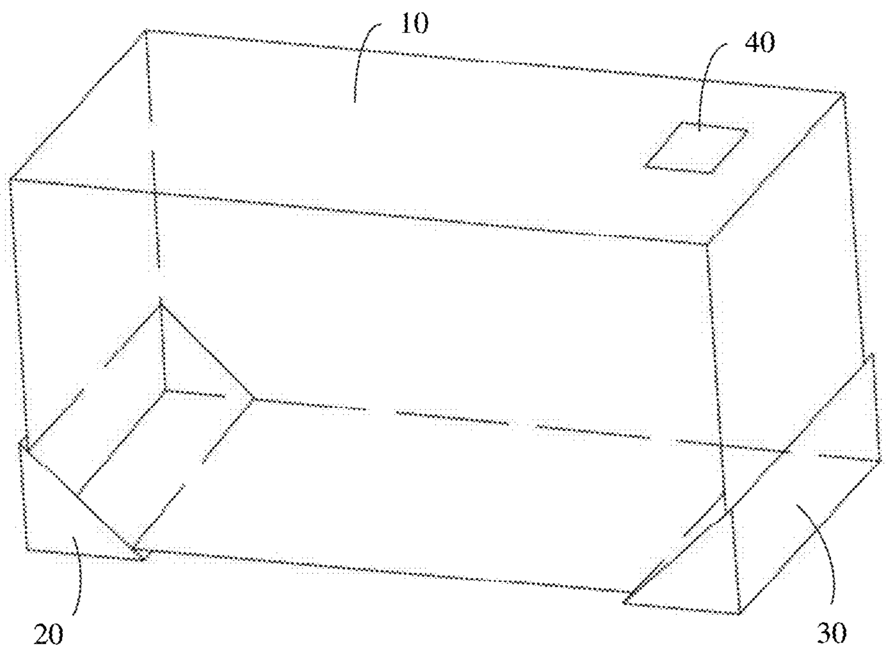
FIG. 4*a* is a schematic of a structure of a ferrite bead according to an embodiment of this application.
Figure 4B:
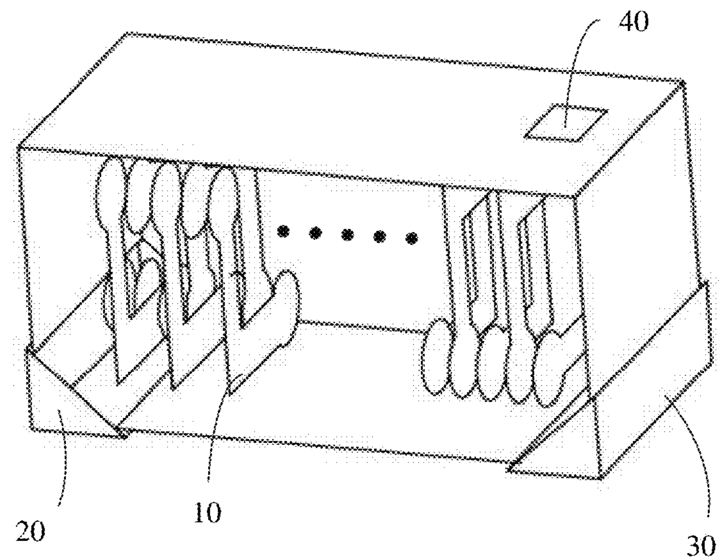
FIG. 4*b* is a local perspective view of FIG. 4*a;*

Refer to FIG. 4*a* and FIG. 4*b*. An embodiment of this application provides a ferrite bead. The ferrite bead may include a ferrite bead body 10, an external terminal 40 disposed on a surface of the ferrite bead body 10, and a first fastening terminal 20 and a second fastening terminal 30 that are connected to the ferrite bead body 10 and that are configured to fasten the ferrite bead body 10. The ferrite bead body 10 includes a coil structure. The coil structure has a first electrical connection end and a second electrical connection end. At least one of the first electrical connection end and the second electrical connection end may be electrically connected to the external terminal 40, and an area of the external terminal 40 may be less than an area of the first fastening terminal 20 and an area of the second fastening terminal 30. In this structure, the at least one of the first electrical connection end and the second electrical connection end of the ferrite bead body 10 may be electrically connected to the external terminal 40, and the area of the external terminal 40 is less than the area of the first fastening terminal 20 and the area of the second fastening terminal 30. This indicates that a parasitic capacitance generated between the external terminal 40 and the ferrite bead body 10 is less than a parasitic capacitance generated between the first fastening terminal 20 or the second fastening terminal 30 and the ferrite bead body 10. In this way, a parasitic capacitance generated inside the ferrite bead is reduced, and a bandwidth of the ferrite bead is increased. In addition, when the ferrite bead is used in a bias circuit, and the ferrite bead is disposed on a substrate, because at least one fastening terminal is not electrically connected, an external parasitic capacitance generated between the ferrite bead and the substrate is correspondingly reduced, so that the bandwidth of the ferrite bead is further increased, and the bandwidth of the ferrite bead is greater than or equal to 60 GHz.

It should be noted that a specific structure of the coil structure in the ferrite bead body 10 may be the same as a specific structure of the thin-film coil in a conventional technology. The ferrite bead body and the coil structure are not specifically limited in this application.

In a possible embodiment, an axis of the coil structure may extend in a horizontal direction (that is, the disposition manner in FIG. 1*c* and FIG. 1*e*), or an axis of the coil structure may extend in a vertical direction (that is, the disposition manner in FIG. 1*a*). When the axis of the coil structure extends in the horizontal direction, the first fastening terminal 20 and the second fastening terminal 30 may be disposed at two ends on a same side of the axis of the ferrite bead body 10. When the axis of the coil structure extends in the vertical direction, the first fastening terminal 20 and the second fastening terminal 30 are disposed at two ends on two sides of the axis of the coil structure.

It should be noted that, when the axis of the coil structure in the ferrite bead body 10 may extend in the horizontal direction, the first fastening terminal 20 and the second fastening terminal 30 are disposed on the same side of the axis of the coil structure in the ferrite bead body 10, to reduce sizes of the first fastening terminal 20 and the second fastening terminal 30, thereby helping reduce the parasitic capacitance inside the ferrite bead.

Still refer to FIG. 4*a* and FIG. 4*b*. When there is one external terminal 40, the external terminal 40 may be electrically connected to the first electrical connection end of the coil structure in the ferrite bead body 10, and the second electrical connection end of the coil structure in the ferrite bead body 10 may be electrically connected to the first fastening terminal 20. Alternatively, the external terminal 40 may be electrically connected to the second electrical connection end of the coil structure in the ferrite bead body 10, and the first electrical connection end of the coil structure in the ferrite bead body 10 may be electrically connected to the second fastening terminal 30. In this case, one of the first fastening terminal 20 and the second fastening terminal 30 is not electrically connected, and the area of the external terminal 40 is less than the area of the first fastening terminal

20 and the area of the second fastening terminal 30. The parasitic capacitance generated between the external terminal 40 and the ferrite bead body 10 is less than the parasitic capacitance generated between the first fastening terminal 20 or the second fastening terminal 30 and the ferrite bead body 10, to reduce the parasitic capacitance inside the ferrite bead. In addition, when the ferrite bead is disposed on the substrate, an external parasitic capacitance generated between the external terminal 40 and the substrate is also less than an external parasitic capacitance generated between the first fastening terminal 20 or the second fastening terminal 30 and the substrate, to increase the bandwidth of the ferrite bead.

Figure 5A:
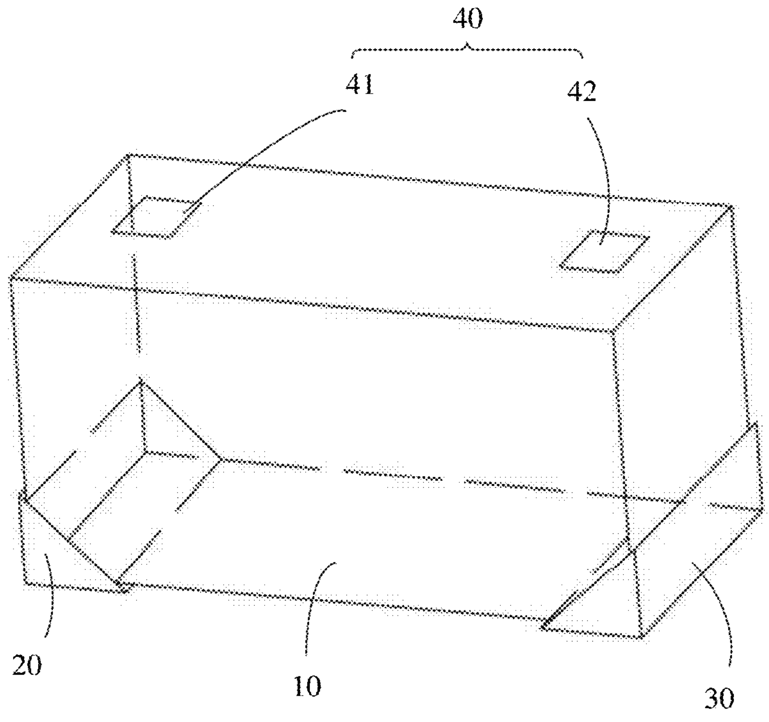
FIG. 5*a* is a schematic of another structure of a ferrite bead according to an embodiment of this application.
Figure 5B:
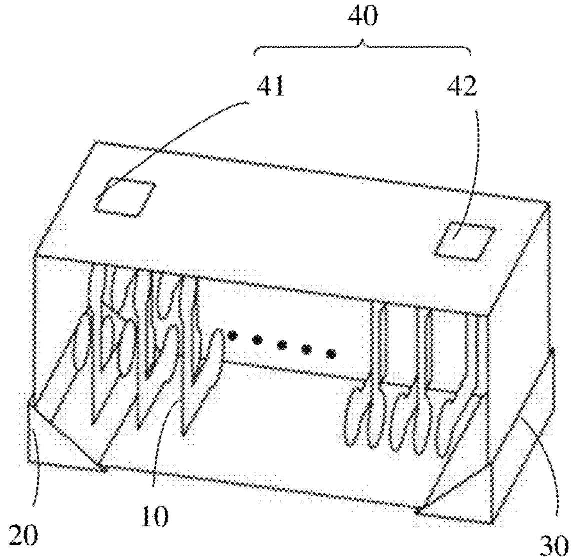
FIG. 5*b* is a local perspective view of FIG. 5*a;*

Refer to FIG. 5*a* and FIG. 5*b*. In a possible embodiment, the external terminal 40 may alternatively include a first external terminal 41 and a second external terminal 42. The first external terminal 41 and the second external terminal 42 may be respectively electrically connected to the second electrical connection end and the first electrical connection end of the coil structure in the ferrite bead body 10. In this case, neither the first fastening terminal 20 nor the second fastening terminal 30 disposed at the two ends of the ferrite bead body 10 is electrically connected to the ferrite bead body 10, and the parasitic capacitance inside the ferrite bead is generated between the first external terminal 41 and the ferrite bead body 10 and between the second external terminal 42 and the ferrite bead body 10. Because an area of the first external terminal 41 and an area of the second external terminal 42 each are smaller than the area of the first fastening terminal 20 and the area of the second fastening terminal 30, it is illustrated that the parasitic capacitance inside the ferrite bead disposed in this manner is lower than the parasitic capacitance generated by the ferrite bead in the conventional technology, that is, the bandwidth of the ferrite bead is increased. In addition, when the ferrite bead is disposed on the substrate, because the area of the first external terminal 41 and the area of the second external terminal 42 each are smaller than the area of the first fastening terminal 20 and the area of the second fastening terminal 30, an external parasitic capacitance generated between the first external terminal 41 or the second external terminal 42 and the substrate is also reduced, to further increase a bandwidth existing when the ferrite bead is disposed on the substrate.

Figure 6:
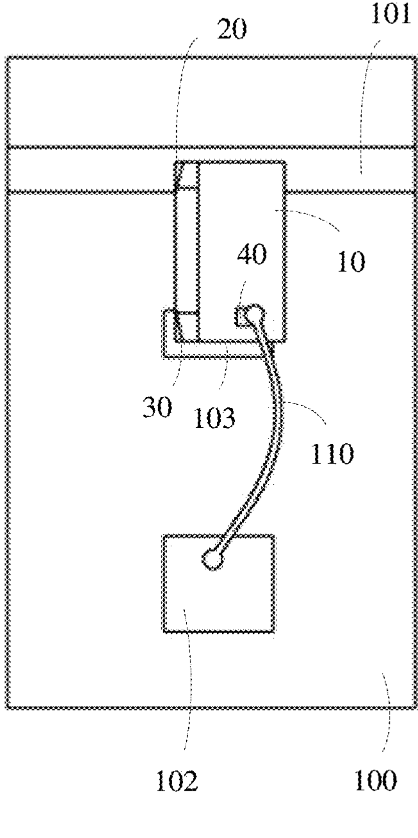
FIG. 6 is a schematic of a structure of a bias circuit according to an embodiment of this application.

This application further provides a bias circuit. Refer to FIG. 6. The bias circuit may include a substrate 100 and the ferrite bead in any one of the foregoing technical solutions. The ferrite bead is fastened on the substrate 100. A trace 101, a first pad 102, and a second pad 103 may be disposed on the substrate 100. The second pad 103 is configured to fasten the ferrite bead. The second electrical connection end and the first electrical connection end of the coil structure in the ferrite bead body 10 may be respectively connected to the trace 101 and the first pad 102 (the second electrical connection end is connected to the trace 101, and the first electrical connection end is connected to the first pad 102). Specifically, because at least one of the first fastening terminal 20 and the second fastening terminal 30 in the ferrite bead is not electrically connected to an external circuit, an external parasitic capacitance between the ferrite bead and the substrate 100 may be reduced, so that the ferrite bead used in the bias circuit has a high bandwidth.

Still refer to FIG. 6. In a possible embodiment, when there may be one ferrite bead disposed in the bias circuit and there is one external terminal 40 in the ferrite bead, the first electrical connection end of the coil structure in the ferrite bead body 10 may be connected to the external terminal 40, and the second electrical connection end is electrically connected to the first fastening terminal 20. Specifically, when there is one ferrite bead, the first fastening terminal 20 may be fastened to the trace 101, and the second fastening terminal 30 may be welded to the second pad 103. In this way, the ferrite bead is stably disposed on the substrate 100, and the external terminal 40 may be connected to the first pad 102 on the substrate through a wire 110, to ensure that a current flows in the ferrite bead body 10 of the ferrite bead. In this manner, the external terminal 40 may be disposed on a side that is of the ferrite bead body 10 and that is away from the substrate 100. The area of the external terminal 40 is less than the area of the second fastening terminal 30, and a distance between the external terminal 40 and the substrate 100 is greater than a distance between the second fastening terminal 30 and the substrate 100. Therefore, it is indicated that an external parasitic capacitance generated between the external terminal 40 and the substrate 100 is less than an external parasitic capacitance generated between the second fastening terminal 30 and the substrate 100. In this case, the external parasitic capacitance generated by the ferrite bead is generated between the first fastening terminal 20 and the substrate 100 and between the external terminal 40 and the substrate 100. Compared with the conventional technology, an external parasitic capacitance generated between the first fastening terminal 20 or the second fastening terminal 30 and the substrate 100 is significantly reduced, to increase the bandwidth of the ferrite bead. In addition, the ferrite bead is connected to the first pad 102 through the wire 110, which can improve flexibility of disposing the ferrite bead on the substrate 100, and reduce a size of the bias circuit, thereby facilitating miniaturization of the bias circuit.

It should be noted that the second electrical connection end of the ferrite bead may be electrically connected to the second fastening terminal 30, and the first electrical connection end may be connected to the external terminal 40. The second fastening terminal 30 may be fastened to the trace 101, and the first fastening terminal 20 may be welded to the second pad 103, so that the ferrite bead is fastened on the substrate. The external terminal 40 may be connected to the first pad 102 on the substrate 100 through a wire. This manner can also achieve the foregoing effect, and details are not described herein again.

Figure 7:
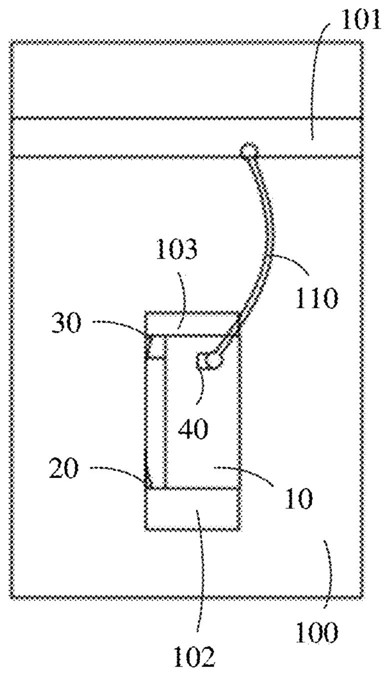
FIG. 7 is a schematic of another structure of a bias circuit according to an embodiment of this application.

Refer to FIG. 7. When there is one ferrite bead and there is one external terminal 40 in the ferrite bead, the external terminal 40 is connected to the second electrical connection end, and the first electrical connection end is connected to the first fastening terminal 20. The first fastening terminal 20 may be further welded to the first pad 102, and the second fastening terminal 30 may be welded to the second pad 103. In this way, the ferrite bead is stably disposed on the substrate 100, and the external terminal 40 may be connected to the trace 101 on the substrate 100 through a wire 110, to ensure that a current flows in the ferrite bead body 10 of the ferrite bead. This manner has advantages of increasing the bandwidth of the ferrite bead and facilitating miniaturization of the bias circuit, and can also avoid a sudden change of impedance at a contact position between the trace 101 and the ferrite bead, to improve performance of the bias circuit. In addition, when the ferrite bead and the trace are not on a same plane, the ferrite bead may still be electrically connected to the trace 101.

In addition, when the second electrical connection end of the ferrite bead is electrically connected to the external terminal 40, the first electrical connection end is electrically connected to the second fastening terminal 30, and the second fastening terminal 30 is welded to the first pad 102, effect generated is the same as effect generated when the first electrical connection end of the ferrite bead body 10 is electrically connected to the first fastening terminal 20, and details are not described herein again.

Figure 8:
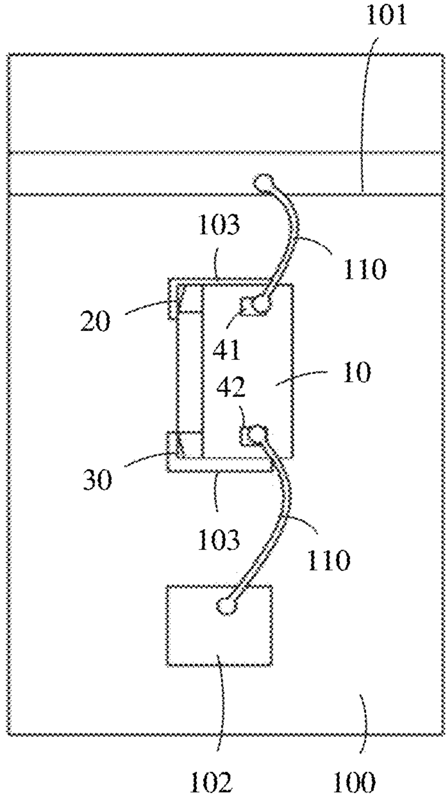
FIG. 8 is a schematic of still another structure of a bias circuit according to an embodiment of this application.

Refer to FIG. 8. In a possible embodiment, when there may be one ferrite bead disposed in the bias circuit, the external terminal in the ferrite bead may include the first external terminal 41 and the second external terminal 42, and the second electrical connection end and the first electrical connection end in the ferrite bead are respectively electrically connected to the first external terminal 41 and the second external terminal 42, the first fastening terminal 20 and the second fastening terminal 30 are separately welded to the second pad 103, so that the ferrite bead is fastened on the substrate 100, and the first external terminal 41 and the second external terminal 42 may be respectively electrically connected to the trace 101 and the first pad 102 through a wire 110. In this way, the ferrite bead is electrically connected to the bias circuit. In this case, both the first external terminal 41 and the second external terminal 42 may be disposed on a side that is of the ferrite bead body 10 and that is away from the substrate 100. Because the area of the first external terminal 41 and the area of the second external terminal 42 each are less than the area of the first fastening terminal 20 and the area of the second fastening terminal 30, the parasitic capacitance generated between the first external terminal 41 or the second external terminal 42 and the ferrite bead body 10 is less than the parasitic capacitance generated between the first fastening terminal 20 or the second fastening terminal 30 and the ferrite bead body 10. An external parasitic capacitance between the first external terminal 41 or the second external terminal 42 and the substrate 100 is less than an external parasitic capacitance generated between the first fastening terminal 20 or the second fastening terminal 30 and the substrate 100, to increase the bandwidth of the ferrite bead. In addition, the ferrite bead is connected to the first pad 102 and the trace 101 through the wire, which can improve flexibility of arranging the ferrite bead on the substrate 100, reduce an overall size of the bias circuit, and facilitate miniaturization of the bias circuit. In addition, because the trace 101 is not in direct contact with the first fastening terminal 20 and the second fastening terminal 30, a sudden change of impedance at a contact position between the trace 101 and the ferrite bead can be effectively avoided, to improve performance of the bias circuit. In addition, when the ferrite bead and the trace are not on a same plane, the ferrite bead may still be electrically connected to the trace 101.

Figure 9:
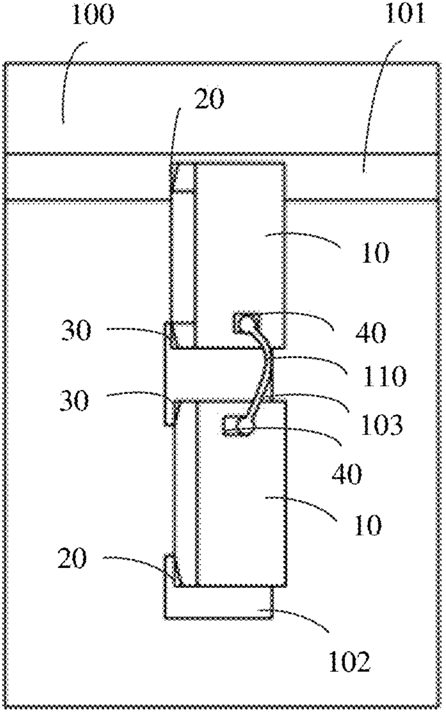
FIG. 9 is a schematic of yet another structure of a bias circuit according to an embodiment of this application.

In a possible embodiment, a plurality of ferrite beads may be disposed in the bias circuit. Specifically, an example in which a same type of two ferrite beads are disposed in the bias circuit is used for description. Refer to FIG. 9. When there may be two ferrite beads in the bias circuit, and there is one external terminal in each ferrite bead, a first fastening terminal 20 or a second fastening terminal 30 on one ferrite bead is fastened to the trace and electrically connected to the trace 101 (the first fastening terminal 20 or the second fastening terminal 30 connected to the trace 101 is further connected to a first electrical connection end or a second electrical connection end in a ferrite bead body 10). A first fastening terminal 20 or a second fastening terminal 30 on the other ferrite bead is electrically connected to the first pad 102, and external terminals 40 on the two ferrite beads are connected through a wire 110. A second fastening terminal 30 or a first fastening terminal 20 on one ferrite bead and a second fastening terminal 30 or a first fastening terminal 20 on the other ferrite bead are welded to one second pad 103 on the substrate 100, or may be welded to two second pads 103. In FIG. 9, first fastening terminals 20 of the two ferrite beads are respectively connected to the trace 101 and the first pad 102, the external terminal 40 corresponds to the second fastening terminal 30, and the second fastening terminal 30 is not electrically connected. The external terminal 40 may be disposed on a side that is of the ferrite bead body 10 and that is away from the substrate 100, and the area of the external terminal 40 is less than the area of the second fastening terminal 30. Therefore, it is indicated that an external parasitic capacitance generated between the external terminal 40 and the substrate 100 is less than an external parasitic capacitance generated between the second fastening terminal 30 and the substrate 100. Compared with the conventional technology, an external parasitic capacitance generated between the first fastening terminal 20 or the second fastening terminal 30 and the substrate 100 is significantly reduced, to increase the bandwidth of the ferrite bead.

It should be noted that, when there may be two ferrite beads in the bias circuit, and each ferrite bead has one external terminal 40, the ferrite bead may be disposed in another form, for example: The two ferrite beads may be respectively connected to the trace 101 and the first pad 102 through a wire 110, and the two adjacent ferrite beads may be welded to one second pad 103, so that the two ferrite beads are electrically connected. In this disposition manner, when the bandwidth is increased, flexibility of disposing the ferrite beads on the substrate 100 may be improved, to reduce a size of the bias circuit and facilitate miniaturization of the bias circuit.

Figure 10:
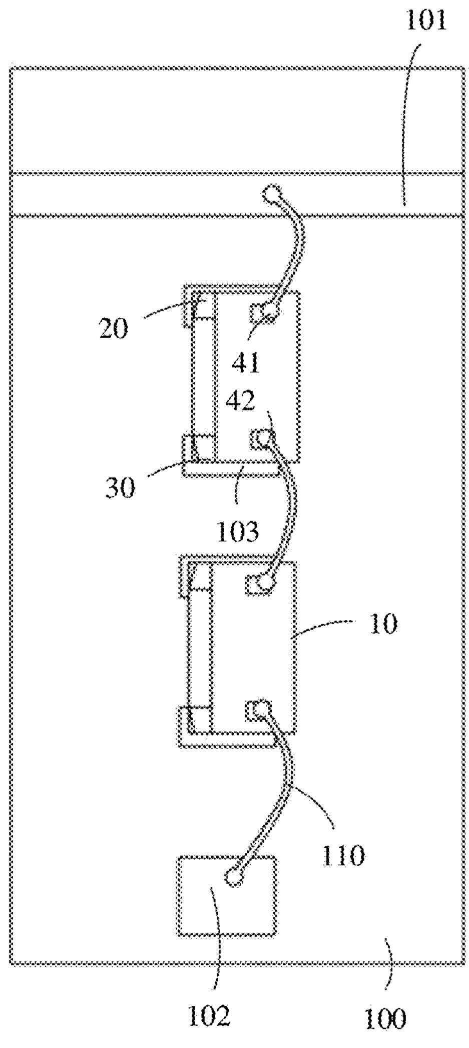
FIG. 10 is a schematic of still yet another structure of a bias circuit according to an embodiment of this application.

Refer to FIG. 10. When there may be two ferrite beads in the bias circuit, and each of external terminals in each ferrite bead includes a first external terminal 41 and a second external terminal 42, both the first fastening terminal 20 and the second fastening terminal 30 of each ferrite bead are welded to the second pad 103, first external terminals 41 or second external terminals 42 of the two ferrite beads are electrically connected to the trace 101 and the first pad 102 located on the substrate 100 through a wire, and the two ferrite beads are electrically connected through a wire 110. Effect of this disposition manner is the same as effect generated when one ferrite bead (the ferrite bead including the first external terminal 41 and the second external terminal 42) is disposed, and details are not described herein again.

It should be noted that, when there are a plurality of ferrite beads disposed in the bias circuit, the plurality of ferrite beads may be a mixture of a ferrite bead including one external terminal and a ferrite bead including a first external terminal and a second external terminal. When two different types of ferrite beads are used together, the bandwidth can also be increased.

Figure 11:
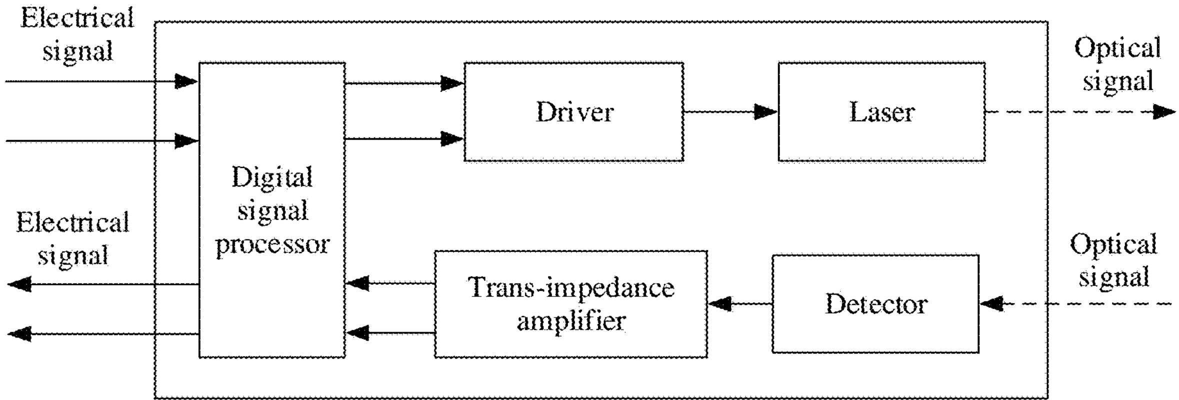
FIG. 11 is a schematic of a structure of an optical module according to an embodiment of this application.

Refer to FIG. 11. This application further provides an optical module, including a housing and the bias circuit that is in any one of the foregoing technical solutions and that is disposed in the housing, and further including a digital signal processor, a driver, a laser, an optical detector, and a trans-impedance amplifier that are disposed in the housing. An electrical signal may enter the driver through the digital signal processor, the electrical signal that passes through the driver enters the laser, and the laser converts the electrical signal into an optical signal for transmission. The optical signal may enter the digital signal processor through the optical detector and the trans-impedance amplifier, and the digital signal processor may convert the optical signal into an electrical signal for transmission. The bias circuit may be disposed between the driver and the laser, and a bias circuit may also be disposed in the digital signal processor. Because this kind of bias circuits are disposed, a rate of the optical module can be increased.

Based on a same technical concept, this application further provides a communication device. The communication device may include a processor and the foregoing optical module. More specifically, the communication device may further include an outer housing. Both the processor and the optical module may be disposed in the outer housing. The optical module may be connected to the processor and the outside through an optical fiber. Because the rate of the optical module is high, a rate of a communication device having the optical module is also high, to meet a requirement for fast communication. The communication device may be an optical communication device, a router, a switch, a server, or the like.

The foregoing descriptions are merely specific implementations of this application, but are not intended to limit a protection scope of this application. Any variation or replacement readily figured out by a person skilled in the art within the technical scope disclosed in this application shall fall within the protection scope of this application. Therefore, the protection scope of this application shall be subject to a protection scope of the claims.

What is claimed is:

1. A ferrite bead, comprising: a ferrite bead body, a first fastening terminal, a second fastening terminal, and an external terminal, wherein each of the first fastening terminal and the second fastening terminal is connected to the ferrite bead body, and is configured to fasten the ferrite bead body; the ferrite bead body comprises a coil structure, the coil structure has a first electrical connection end and a second electrical connection end, the external terminal is disposed on a surface of the ferrite bead body, and at least one of the first electrical connection end and the second electrical connection end is electrically connected to the external terminal; and an area of the external terminal is less than each of an area of the first fastening terminal and an area of the second fastening terminal, wherein the external terminal is electrically connected to the first electrical connection end, and the second electrical connection end is electrically connected to the first fastening terminal or the second fastening terminal; or the external terminal is electrically connected to the second electrical connection end, and the first electrical connection end is electrically connected to the first fastening terminal or the second fastening terminal.

2. The ferrite bead according to claim 1, wherein the first fastening terminal and the second fastening terminal are disposed at two ends of the ferrite bead body.

3. The ferrite bead according to claim 1, wherein the external terminal comprises a first external terminal and a second external terminal, the first external terminal is electrically connected to the second electrical connection end, and the second external terminal is electrically connected to the first electrical connection end.

4. A bias circuit, comprising: a substrate and at least one ferrite bead according to claim 1 that is disposed on the substrate, wherein a trace, a first pad, and a second pad are disposed on the substrate, the second pad is configured to fasten the ferrite bead, the first electrical connection end is connected to the first pad, and the second electrical connection end is connected to the trace.

5. The bias circuit according to claim 4, wherein the at least one ferrite bead is one ferrite bead, the external terminal comprised in the one ferrite bead is connected to the first electrical connection end, the second electrical connection end is electrically connected to the first fastening terminal or the second fastening terminal, the first fastening terminal or the second fastening terminal is electrically connected to the trace, the second fastening terminal or the first fastening terminal is welded to the second pad, and the external terminal is electrically connected to the first pad on the substrate through a wire; or the at least one ferrite bead is one ferrite bead, the external terminal comprised in the one ferrite bead is connected to the second electrical connection end, the first electrical connection end is connected to the second fastening terminal or the first fastening terminal, the second fastening terminal or the first fastening terminal is connected to the first pad, the first fastening terminal or the second fastening terminal is connected to the second pad, and the external terminal is electrically connected to the trace through a wire.

6. The bias circuit according to claim 4, wherein the at least one ferrite bead comprises two ferrite beads, the external terminal comprised in each ferrite bead of the two ferrite beads is electrically connected to the first electrical connection end, and the second electrical connection end is electrically connected to the first fastening terminal or the second fastening terminal; or the external terminal is electrically connected to the second electrical connection end, and the first electrical connection end is electrically connected to the first fastening terminal or the second fastening terminal; and a first fastening terminal or a second fastening terminal on one of the ferrite beads of the two ferrite beads is fastened to the trace and electrically connected to the trace, a first fastening terminal or a second fastening terminal on the other ferrite bead of the two ferrite beads is electrically connected to the first pad on the substrate, and external terminals on the two ferrite beads are connected through a wire.

7. The bias circuit according to claim 6, wherein a second fastening terminal or a first fastening terminal on said one of the ferrite beads, and a second fastening terminal or a first fastening terminal on the other ferrite bead are welded to the second pad.

8. The bias circuit according to claim 4, wherein the at least one ferrite bead is one ferrite bead, the external terminal comprised in the one ferrite bead comprises a first external terminal and a second external terminal, the first external terminal is electrically connected to the second electrical connection end, and the second external terminal is electrically connected to the first electrical connection end; and the first fastening terminal and the second fastening terminal of the one ferrite bead are welded to the second pad, the first external terminal is electrically connected to the trace through a wire, and the second external terminal is electrically connected to the first pad on the substrate through a wire.

9. The bias circuit according to claim 4, wherein the at least one ferrite bead comprises two ferrite beads, the external terminal comprised in each ferrite bead of the two ferrite beads comprises a first external terminal and a second external terminal, the first external terminal is electrically connected to the second electrical connection end, and the second external terminal is electrically connected to the first electrical connection end; and both the first fastening terminal and the second fastening terminal of said each ferrite bead are welded to the second pad, first external terminals or second external terminals of the two ferrite beads are electrically connected to the trace and the first pad located on the substrate through a wire, and the two ferrite beads are electrically connected through a wire.

10. An optical module, comprising a housing and a bias circuit disposed in the housing, wherein the bias circuit comprises: a substrate and at least one ferrite bead that is disposed on the substrate, wherein a trace, a first pad, and a second pad are disposed on the substrate, the second pad is configured to fasten the at least one ferrite bead, a first electrical connection end of the at least one ferrite bead is connected to the first pad, and a second electrical connection end of the at least one ferrite bead is connected to the trace; wherein the at least one ferrite bead comprises: a ferrite bead body, the first fastening terminal, the second fastening terminal, and an external terminal, wherein each of the first fastening terminal and the second fastening terminal is connected to the ferrite bead body, and is configured to fasten the ferrite bead body;

the ferrite bead body comprises a coil structure, the coil structure has a first electrical connection end and a second electrical connection end, the external terminal is disposed on a surface of the ferrite bead body, and at least one of the first electrical connection end and the second electrical connection end is electrically connected to the external terminal; and an area of the external terminal is less than each of an area of the first fastening terminal and an area of the second fastening terminal.

11. The optical module according to claim 10, wherein the at least one ferrite bead is one ferrite bead, the external terminal comprised in the one ferrite bead is connected to the first electrical connection end, the second electrical connection end is electrically connected to the first fastening terminal or the second fastening terminal, the first fastening terminal or the second fastening terminal is electrically connected to the trace, the second fastening terminal or the first fastening terminal is welded to the second pad, and the external terminal is electrically connected to the first pad on the substrate through a wire; or the at least one ferrite bead is one ferrite bead, the external terminal comprised in the one ferrite bead is connected to the second electrical connection end, the first electrical connection end is connected to the second fastening terminal or the first fastening terminal, the second fastening terminal or the first fastening terminal is connected to the first pad, the first fastening terminal or the second fastening terminal is connected to the second pad, and the external terminal is electrically connected to the trace through a wire.

12. The optical module according to claim 10, wherein the at least one ferrite bead comprises two ferrite beads, the external terminal comprised in each ferrite bead of the two ferrite beads is electrically connected to the first electrical connection end, and the second electrical connection end is electrically connected to the first fastening terminal or the second fastening terminal; or the external terminal is electrically connected to the second electrical connection end, and the first electrical connection end is electrically connected to the first fastening terminal or the second fastening terminal; and a first fastening terminal or a second fastening terminal on one of the ferrite beads of the two ferrite beads is fastened to the trace and electrically connected to the trace, a first fastening terminal or a second fastening terminal on the other ferrite bead of the two ferrite beads is electrically connected to the first pad on the substrate, and external terminals on the two ferrite beads are connected through a wire.

13. The optical module according to claim 10, wherein the first fastening terminal and the second fastening terminal are disposed at two ends of the ferrite bead body.

14. The optical module according to claim 10, wherein the external terminal is electrically connected to the first electrical connection end, and the second electrical connection end is electrically connected to the first fastening terminal or the second fastening terminal; or the external terminal is electrically connected to the second electrical connection end, and the first electrical connection end is electrically connected to the first fastening terminal or the second fastening terminal.

15. The optical module according to claim 10, wherein the external terminal comprises a first external terminal and a second external terminal, the first external terminal is electrically connected to the second electrical connection end, and the second external terminal is electrically connected to the first electrical connection end.

* * * * *